US012719024B2

(12) United States Patent
Kozlowski et al.

(10) Patent No.: US 12,719,024 B2
(45) **Date of Patent: *Aug. 25, 2026**

(54) PLASMA APPARATUS AND METHODS FOR PROCESSING FEED MATERIAL UTILIZING AN UPSTREAM SWIRL MODULE AND COMPOSITE GAS FLOWS

(71) Applicant: 6K Inc., North Andover, MA (US)

(72) Inventors: Michael C. Kozlowski, Reading, MA (US); Michael Resnick, Lawrence, MA (US); Pawel Matys, Jupiter, FL (US)

(73) Assignee: 6K Inc., North Andover, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/765,824

(22) Filed: Jul. 8, 2024

(65) Prior Publication Data

US 2025/0014869 A1 Jan. 9, 2025

Related U.S. Application Data

(63) Continuation of application No. 18/330,602, filed on Jun. 7, 2023, now Pat. No. 12,040,162.

(60) Provisional application No. 63/350,746, filed on Jun. 9, 2022.

(51) Int. Cl.
*H01J 37/32* (2006.01)

(52) U.S. Cl.
CPC .. *H01J 37/32449* (2013.01); *H01J 37/32201* (2013.01)

(58) Field of Classification Search
None
See application file for complete search history.

(56) References Cited

U.S. PATENT DOCUMENTS 5,395,453 A * 3/1995 Noda ................. H01J 37/32311 427/575
5,909,277 A * 6/1999 Woskov ................. G01N 21/73 356/316
8,748,785 B2 * 6/2014 Jordan .................... B05B 7/226 219/121.36
9,932,673 B2 * 4/2018 Jordan .................. C23C 16/511
2008/0055594 A1 * 3/2008 Hadidi ..................... H05H 1/30 356/316
2008/0173641 A1 * 7/2008 Hadidi ..................... H05H 1/30 219/121.36
2012/0224175 A1 * 9/2012 Minghetti .......... G01N 21/6404 356/316
2013/0075390 A1 * 3/2013 Ashida .............. H01J 37/32266 219/702
2013/0087285 A1 * 4/2013 Kofuji .............. H01J 37/32192 156/345.33
2014/0287162 A1 * 9/2014 Jordan .................... B05B 7/226 427/575

(Continued)

FOREIGN PATENT DOCUMENTS

JP 2013069602 A * 4/2013 ........ H01J 37/32302

*Primary Examiner* — Srinivas Sathiraju
(74) *Attorney, Agent, or Firm* — Knobbe, Martens, Olson & Bear, LLP

(57) ABSTRACT

Disclosed herein are systems, methods, and devices processing feed material utilizing an upstream swirl module and composite gas flows. Some embodiments are directed to a microwave plasma apparatus for processing a material, comprising: a first flow module, a second flow module, and a liner.

19 Claims, 9 Drawing Sheets

(56) References Cited

U.S. PATENT DOCUMENTS

2015/0270106 A1* 9/2015 Kobayashi ........ H01J 37/32935 315/34
2016/0172163 A1* 6/2016 Kaneko ............. H01J 37/32211 315/34
2016/0189933 A1* 6/2016 Kobayashi ............. H05B 41/16 315/34
2016/0209043 A1* 7/2016 Gao ........................ F24B 5/021
2016/0284519 A1* 9/2016 Kobayashi .......... H01J 37/3222
2016/0358757 A1* 12/2016 Ikeda ................ H01J 37/32266
2018/0114677 A1* 4/2018 Komatsu ........... H01J 37/32192
2018/0126464 A1* 5/2018 Hadidi .................... C23C 26/00
2018/0130638 A1* 5/2018 Ahmad ............. H01J 37/32229
2018/0138018 A1* 5/2018 Voronin ............ H01J 37/32302
2018/0218883 A1* 8/2018 Iwao ................. H01L 21/67253
2018/0226229 A1* 8/2018 Stowell ............. H01J 37/32229
2018/0294143 A1* 10/2018 Chua ................. H01J 37/32266
2018/0297122 A1* 10/2018 Hadidi ..................... H05H 1/42
2019/0157045 A1* 5/2019 Meloni .................... H05H 1/46
2019/0381564 A1* 12/2019 Barnes .................... B22F 1/142
2020/0203706 A1* 6/2020 Holman ............ H01M 10/0525
2020/0215606 A1* 7/2020 Barnes .................... B22F 1/065
2020/0381217 A1* 12/2020 Kraus ............... H01J 37/32192
2021/0002759 A1* 1/2021 Zhang ............... H01J 37/32192
2021/0057191 A1* 2/2021 Stowell ............. H01J 37/32201
2021/0078072 A1* 3/2021 Barnes ...................... B22F 9/04
2021/0129216 A1* 5/2021 Barnes .................... C22C 19/07
2022/0095445 A1* 3/2022 Shang .................... B33Y 40/10
2022/0228288 A1* 7/2022 Holman ............. C01G 49/0027
2022/0267216 A1* 8/2022 Holman .............. C04B 35/5603
2022/0314325 A1* 10/2022 Badwe .................... B22F 1/065
2023/0001375 A1* 1/2023 Kozlowski ............. B01J 19/126
2023/0001376 A1* 1/2023 Kozlowski ............. B01J 19/088
2023/0032362 A1* 2/2023 Holman ................... C01G 1/02
2023/0219134 A1* 7/2023 Houshmand ............ B22F 1/065
2023/0247751 A1* 8/2023 Kozlowski ............... H05H 1/30 118/620

* cited by examiner

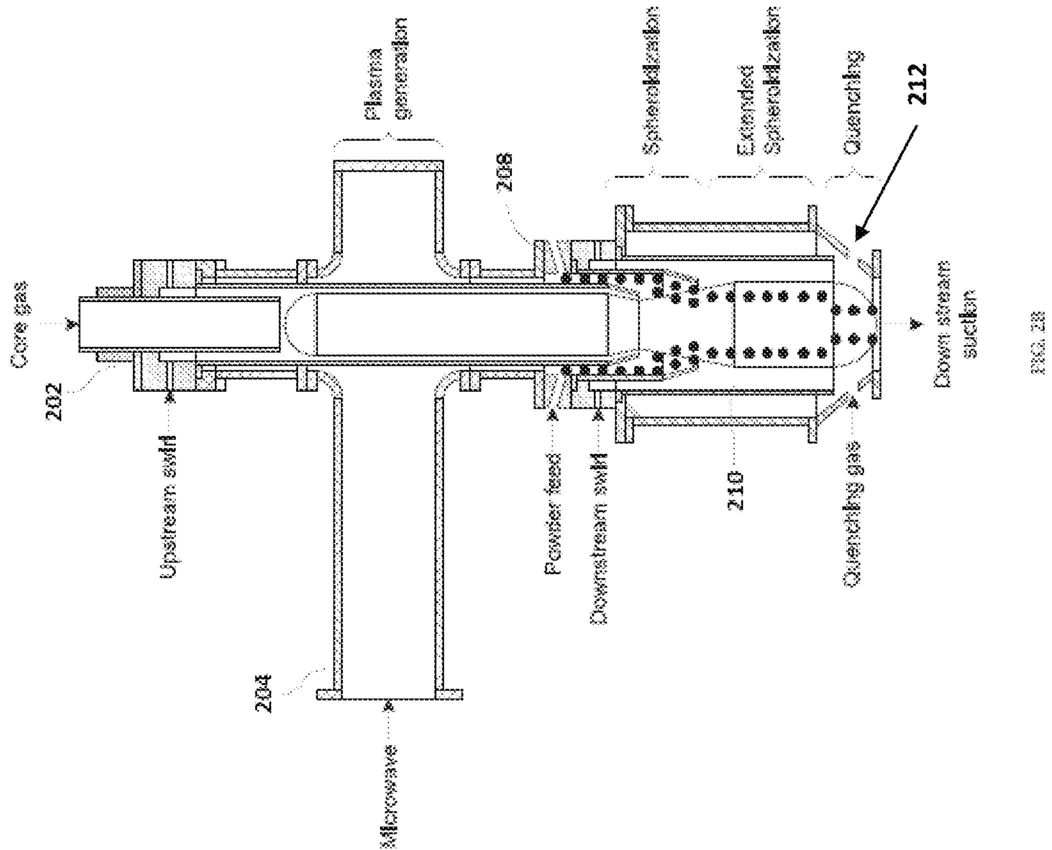
Core gas
202
Upstream swirl
204
Microwave
Plasma generation
208
Powder feed
Downstream swirl
Spheroidization
Extended Spheroidization
Quenching
212
210
Quenching gas
Down stream suction

PLASMA APPARATUS AND METHODS FOR PROCESSING FEED MATERIAL UTILIZING AN UPSTREAM SWIRL MODULE AND COMPOSITE GAS FLOWS

INCORPORATION BY REFERENCE TO ANY PRIORITY APPLICATIONS

This application is a continuation of U.S. patent application Ser. No. 18/330,602, filed Jun. 7, 2023, which claims the priority benefit under 35 U.S.C. § 119 (e) of U.S. Provisional Application No. 63/350,746, filed Jun. 9, 2022, the entire disclosure of which is incorporated herein by reference in its entirety. Any and all applications for which a foreign or domestic priority claim is identified in the Application Data Sheet as filed with the present application are hereby incorporated by reference under 37 CFR 1.57.

BACKGROUND

Field

The present invention relates to apparatuses and methods for plasma material processing and, more particularly, to apparatuses and methods for microwave plasma material processing.

Description

Plasma torches generate and provide high temperature directed flows of plasma for a variety of purposes. The two main types of plasma torches are induction plasma torches and microwave plasma torches. Generally, inductive plasmas suffer from plasma non-uniformity. This non-uniformity leads to limitations on the ability of inductive plasmas to process certain materials. Furthermore, significant differences exist between the microwave plasma apparatuses and other plasma generation torches, such as induction plasma. For example, microwave plasma is hotter on the interior of the plasma plume, while induction is hotter on the outside of the plumes. In particular, the outer region of an induction plasma can reach about 10,000 K while the inside processing region may only reach about 1,000 K. This large temperature difference leads to material processing and feeding problems. Furthermore, induction plasma apparatuses are unable to process feedstocks at low enough temperatures to avoid melting of certain feed materials without extinguishing the plasma.

A conventional microwave plasma apparatus for processing a material includes a plasma chamber, a microwave radiation source, and a waveguide guiding microwave radiation from the microwave radiation source to the plasma chamber. A process gas flows through the plasma chamber and the microwave radiation couples to the process gas to produce a plasma jet. A process material is introduced to the plasma chamber, becomes entrained in the plasma jet, and is thereby transformed to a stream of product material droplets or particles.

The plasma jet may be stabilized within the plasma chamber by contact with a swirling gas flow. Stabilizing the plasma jet prevents it from contacting the plasma chamber and thereby enables use of conventional refractory materials to contain the extremely high temperatures of the plasma.

SUMMARY

For purposes of this summary, certain aspects, advantages, and novel features of the invention are described herein. It is to be understood that not all such advantages necessarily may be achieved in accordance with any particular embodiment of the invention. Thus, for example, those skilled in the art will recognize that the invention may be embodied or carried out in a manner that achieves one advantage or group of advantages as taught herein without necessarily achieving other advantages as may be taught or suggested herein.

Some embodiments herein are directed to a microwave plasma apparatus for processing a material, comprising: a first flow module, a second flow module, and a liner; a first swirl module in communication with the second flow module, the first swirl module comprising a plurality of first gas inlets, the plurality of first gas inlets configured to generate a first swirl gas flow towards the second swirl module; and the second swirl module comprising a plurality of second gas inlets, the plurality of second gas inlets configured to generate a second swirl gas flow towards the liner, wherein the first swirl module and the second swirl module are configured such that the first swirl gas flow and the second swirl gas flow are combined into a composite gas flow prior to entering the liner.

In some embodiments, the microwave plasma apparatus further comprises a microwave power source in communication with the composite gas flow and configured to provide microwave radiation to generate a microwave plasma upon contact with the composite gas flow. In some embodiments, the microwave power source provides microwave radiation of at least 70 KW.

In some embodiments, The microwave plasma apparatus further comprises one or more feed material inlets in communication with the first flow module, the second flow module, or the liner, the one or more feed material inlets configured to provide a feed material to the microwave plasma.

In some embodiments, the plurality of first gas inlets is configured to generate the first swirl gas flow in a counterclockwise direction. In some embodiments, the plurality of second gas inlets is configured to generate the second swirl gas flow in a counterclockwise direction. In some embodiments, the plurality of gas inlets is configured to generate the second swirl gas flow in a clockwise direction. In some embodiments, the plurality of first gas inlets is configured to generate the first swirl gas flow in a clockwise direction. In some embodiments, the plurality of second gas inlets is configured to generate the second swirl gas flow in a counterclockwise direction. In some embodiments, the plurality of second gas inlets is configured to generate the second swirl gas flow in a clockwise direction.

In some embodiments, the plurality of first gas inlets comprises 2 inlets. In some embodiments, the plurality of second gas inlets comprises 2 inlets. In some embodiments, the plurality of first gas inlets comprises more than 2 inlets. In some embodiments, the plurality of second gas inlets comprises more than 2 inlets.

In some embodiments, at least one of the plurality of first gas inlets is oriented at an angle between 0° and 90° relative to at least one other of the plurality of first gas inlets. In some embodiments, at least one of the plurality of second gas inlets is oriented at an angle between 0° and 90° relative to at least one other of the plurality of second gas inlets.

In some embodiments, wherein the first swirl gas flow comprises an ionizing gas. In some embodiments, the plurality of first gas inlets comprises inlet diameters between about 0.335 inches and about 0.393 inches. In some embodiments, the plurality of second gas inlets comprises inlet diameters between about 0.0161 inches and about 0.0345 inches.

In some embodiments, the first flow module, the second flow module, and the liner are further configured to direct the composite gas flow to a reaction chamber downstream of the liner.

BRIEF DESCRIPTION OF THE DRAWINGS

The drawings are provided to illustrate example embodiments and are not intended to limit the scope of the disclosure. A better understanding of the systems and methods described herein will be appreciated upon reference to the following description in conjunction with the accompanying drawings, wherein:

FIGS. 2A-B illustrates an exemplary microwave plasma torch that includes a side feeding hopper, thus allowing for downstream feeding.

DETAILED DESCRIPTION

Figure 1:
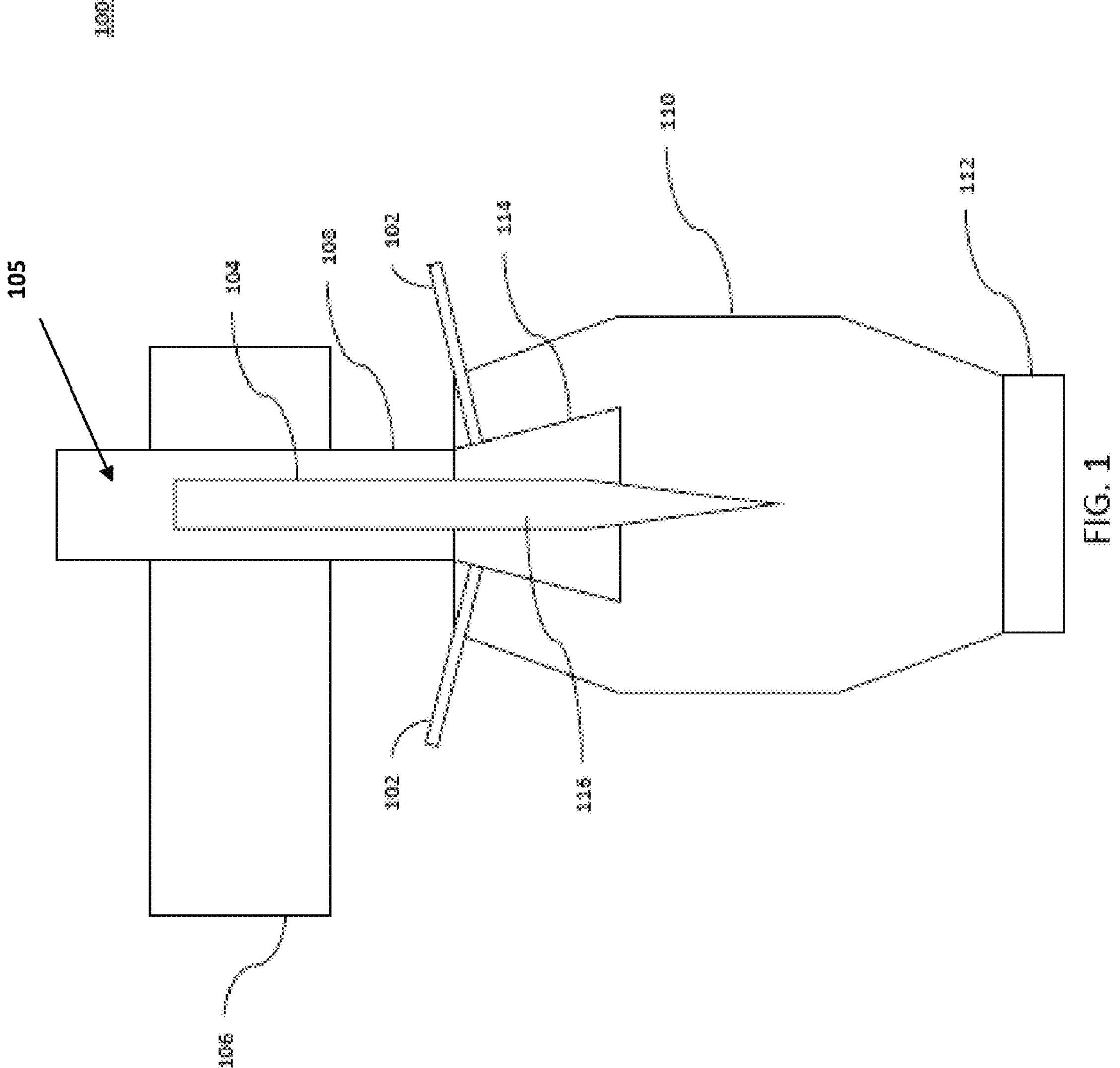
FIG. 1 illustrates an example microwave plasma torch 100 that can be used in the processing of feed material materials.

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto or as presented in the future is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present technology.

In some embodiments, the plasma of a microwave plasma apparatus may be stabilized and centered by a swirl gas flow. For example, small swirl orifice jets may be present within the apparatus to inject swirl gases. The high velocity and swirling action of this swirl gas flow protects the inner diameter of the torch from the high heat associated with the plasma. An annular swirl chamber may be in fluid communication with the interior of the plasma apparatus via a plurality of swirl jets. The swirl jets may be arranged at any angle relative to the core gas flow of the apparatus. For example, the swirl jets may be arranged substantially perpendicular to, and substantially offset from, the main axis and core gas flow. In some embodiments, however, the swirl jets also may be arranged at an angle relative to the axis and core gas flow.

In some embodiments, the plasma generated by the microwave plasma torch can reach extremely high temperatures, on the order of six thousand Kelvin (6,000 K). As such, in some embodiments, the swirl gas may be supplied to the inner surface of the torch prior to ignition of the plasma jet. The swirl gas may be supplied from a swirl gas source through the swirl jets, so as to establish a flow of the swirl gas in a swirling or helical manner between the core gas flow and the inner surface. After ignition of the plasma, the swirling flow of swirl has prevents the plasma jet from adhering to the inner surface, and thereby prevents melting of the plasma chamber by conductive heat transfer between the plasma and the inner surface. The swirl gas also removes a portion of the heat transferred by radiation from the plasma to the inner surface.

FIG. 1 illustrates an example microwave plasma torch 100 that can be used in the production of materials. In some embodiments, a feedstock can be introduced, via one or more feedstock inlets 102, into a microwave plasma 104. In some embodiments, an entrainment gas flow and/or a sheath flow may be injected into the microwave plasma applicator 105 to create flow conditions within the plasma applicator prior to ignition of the plasma 104 via microwave radiation source 106. In some embodiments, the entrainment flow and sheath flow are both axis-symmetric and laminar, while in other embodiments the gas flows are swirling. In some embodiments, the feedstock may be introduced into the microwave plasma torch 100, where the feedstock may be entrained by a gas flow that directs the materials toward the plasma 104.

In some embodiments, within the microwave plasma 104, the feedstock may undergo a physical and/or chemical transformation. Inlets 102 can be used to introduce process gases to entrain and accelerate the feedstock towards plasma 104. In some embodiments, a second swirling gas flow can be created to provide sheathing for the inside wall of a plasma applicator 104 and a reaction chamber 110 to protect those structures from melting due to heat radiation from plasma 104.

Various parameters of microwave plasma 104, as created by the plasma applicator 105, may be adjusted manually or automatically in order to achieve a desired material. These parameters may include, for example, power, plasma gas flow rates, type of plasma gas, presence of an extension tube, extension tube material, level of insulation of the reactor chamber or the extension tube, level of coating of the extension tube, geometry of the extension tube (e.g. tapered/stepped), feed material size, feed material insertion rate, feed material inlet location, feed material inlet orientation, number of feed material inlets, plasma temperature, residence time and cooling rates. The resulting material may exit the plasma into a sealed chamber 112 where the material is quenched then collected.

In some embodiments, the feedstock is injected after the microwave plasma applicator for processing in the "plume" or "exhaust" of the microwave plasma torch. Thus, the plasma of the microwave plasma torch is engaged at the exit end of the plasma torch core tube 108, or further downstream. In some embodiments, adjustable downstream feeding allows engaging the feedstock with the plasma plume downstream at a temperature suitable for optimal melting of feedstock through precise targeting of temperature level and residence time. Adjusting the inlet location and plasma characteristics may allow for further customization of material characteristics. Furthermore, in some embodiments, by adjusting power, gas flow rates, pressure, and equipment configuration (e.g., introducing an extension tube), the length of the plasma plume may be adjusted.

In some embodiments, feeding configurations may include one or more individual feeding nozzles surrounding the plasma plume. The feedstock may enter the plasma from any direction and can be fed in 360° around the plasma depending on the placement and orientation of the inlets 102. Furthermore, the feedstock may enter the plasma at a specific position along the length of the plasma 104 by adjusting placement of the inlets 102, where a specific temperature has been measured and a residence time estimated for providing the desirable characteristics of the resulting material.

In some embodiments, the angle of the inlets 102 relative to the plasma 104 may be adjusted, such that the feedstock can be injected at any angle relative to the plasma 104. In some embodiments, implementation of the downstream injection method may use a downstream swirl or quenching. A downstream swirl refers to an additional swirl component that can be introduced downstream from the plasma applicator to keep the powder from the walls of the applicator 105, the reactor chamber 110, and/or an extension tube 114.

Figure 2A:
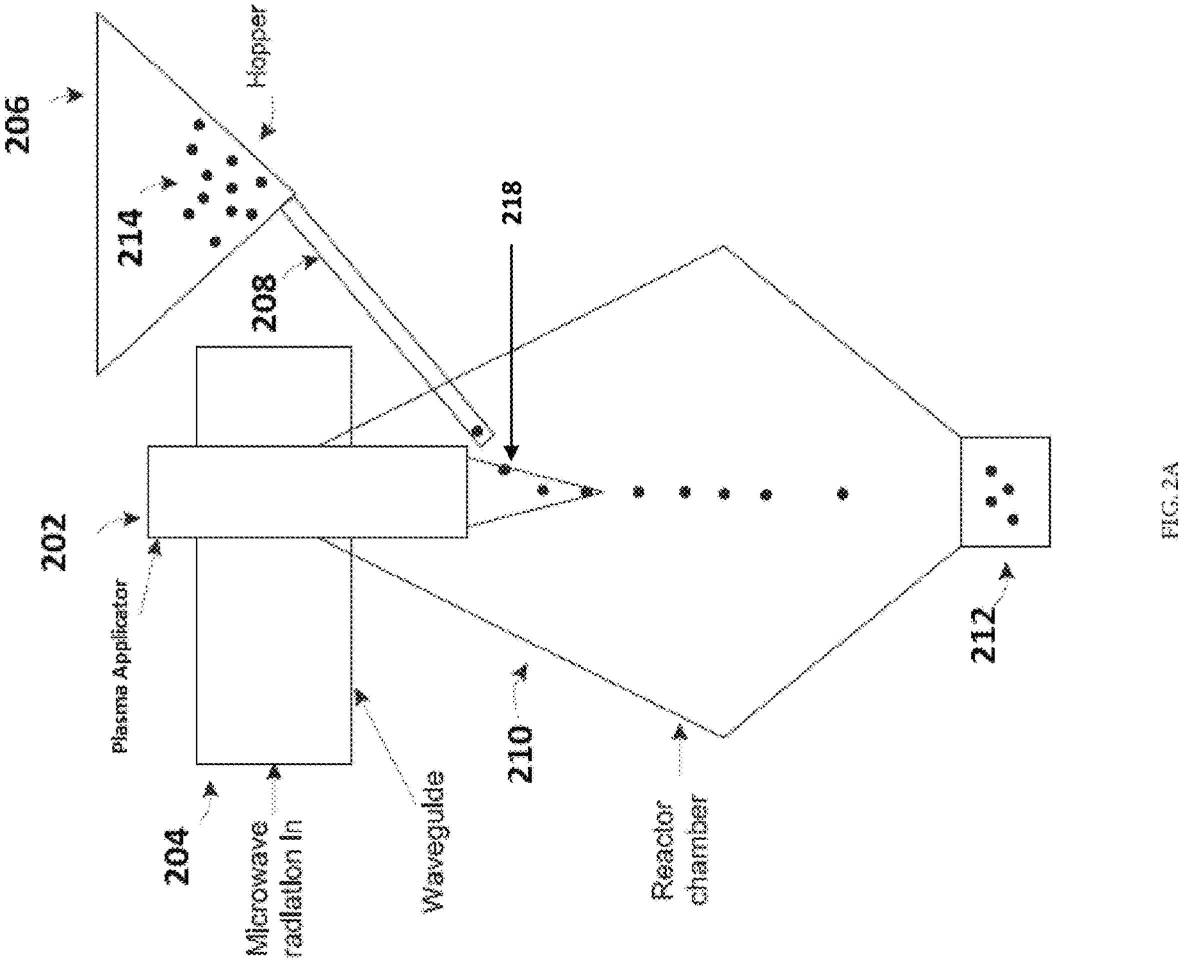

FIGS. 2A-B illustrates an exemplary microwave plasma torch that includes a side feeding hopper, thus allowing for downstream feeding. Thus, in this implementation the feedstock is injected after the microwave plasma torch applicator for processing in the "plume" or "exhaust" of the microwave plasma torch. Thus, the plasma of the microwave plasma torch is engaged at the exit end of the plasma torch to allow downstream feeding of the feedstock, as opposed to the top-feeding (or upstream feeding). This downstream feeding can advantageously extend the lifetime of the torch as the hot zone is preserved indefinitely from any material deposits on the walls of the hot zone liner. Furthermore, it allows engaging the plasma plume downstream at temperature suitable for optimal melting of powders through precise targeting of temperature level and residence time. For example, there is the ability to dial the length of the plume using microwave powder, gas flows, and pressure in the quenching vessel that contains the plasma plume.

Generally, the downstream feeding can utilize two main hardware configurations to establish a stable plasma plume which are: annular torch, such as described in U.S. Pat. Pub. No. 2018/0297122, the entirety of which is hereby incorporated by reference, or swirl torches described in U.S. Pat. Nos. 8,748,785 B2 and 9,932,673 B2, the entireties of which are hereby incorporated by reference. A feed system close-coupled with the plasma plume at the exit of the plasma torch is used to feed powder axisymmetrically to preserve process homogeneity.

Other feeding configurations may include one or several individual feeding nozzles surrounding the plasma plume. The feedstock powder can enter the plasma at a point from any direction and can be fed in from any direction, 360° around the plasma, into the point within the plasma. The feedstock powder can enter the plasma at a specific position along the length of the plasma plume where a specific temperature has been measured and a residence time estimated for sufficient melting of the particles. The melted particles exit the plasma into a sealed chamber where they are quenched then collected.

The feed materials 214 can be introduced into a microwave plasma applicator 202. Hopper 206 can be used to store the feed material 214 before feeding the feed material 214 into the microwave plasma applicator 202, plume and/or exhaust 218. The feed material 214 can be injected at any angle to the longitudinal direction of the plasma applicator 302. 5, 10, 15, 20, 25, 30, 35, 40, 45, 50, or 55 degrees. In some embodiments, the feedstock can be injected at an angle of greater than 5, 10, 15, 20, 25, 30, 35, 40, 45, 50, or 55 degrees. In some embodiments, the feedstock can be injected at an angle of less than 5, 10, 15, 20, 25, 30, 35, 40, 45, 50, or 55 degrees. In alternative embodiments, the feedstock can be injected along the longitudinal axis of the plasma torch.

The microwave radiation can be brought into plasma applicator 202 through waveguide 204. The feed material 214 is fed into a plasma chamber 210 and is placed into contact with the plasma generated by the plasma applicator 202. When in contact with the plasma, plasma plume, or plasma exhaust 218, the feed material melts. While still in the plasma chamber 210, the feed material 214 cools and solidifies before being collected into a container 212. Alternatively, the feed material 214 can exit the plasma chamber 210 through the outlet 212 while still in a melted phase and cool and solidify outside the plasma chamber. In some embodiments, a quenching chamber may be used, which may or may not use positive pressure. While described separately from FIG. 1, the embodiments of FIGS. 2A and 2B are understood to use similar features and conditions to the embodiment of FIG. 1.

Figure 3:
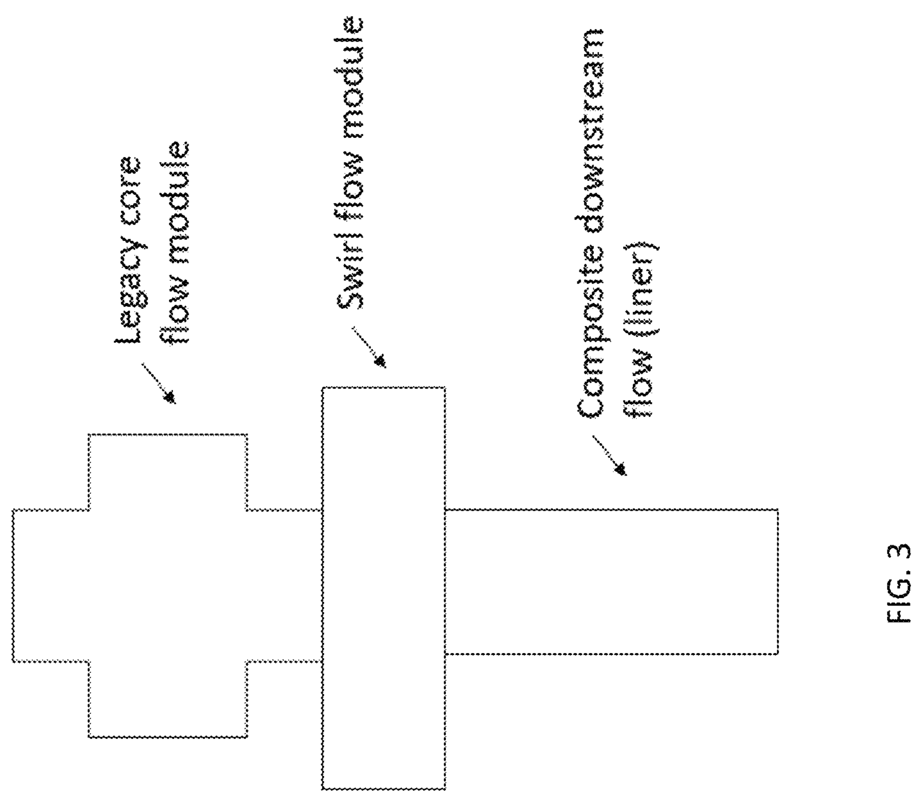
FIG. 3. illustrates another example plasma apparatus for processing feed materials.

FIG. 3 illustrates another example plasma apparatus for processing feed materials. In some embodiments, the swirl gas flow may originate in the swirl chamber or swirl module of the microwave plasma apparatus. The swirl gas flow may be generated in the swirl chamber with small orifice swirl jets that are oriented at an angle relative to the interior surface of the torch, which may comprise a protective liner. The high velocity and swirling action of this flow protects the inner diameter of the torch from the high heat associated with the plasma. In some embodiments, the core gas flow comprising the main ionizing gas originates from a core flow chamber or module upstream of the swirl flow module. In some embodiments, this core gas flow is intended to be substantially straight and to absorb the majority of the microwave energy (relative to the swirling flow).

Figure 4:
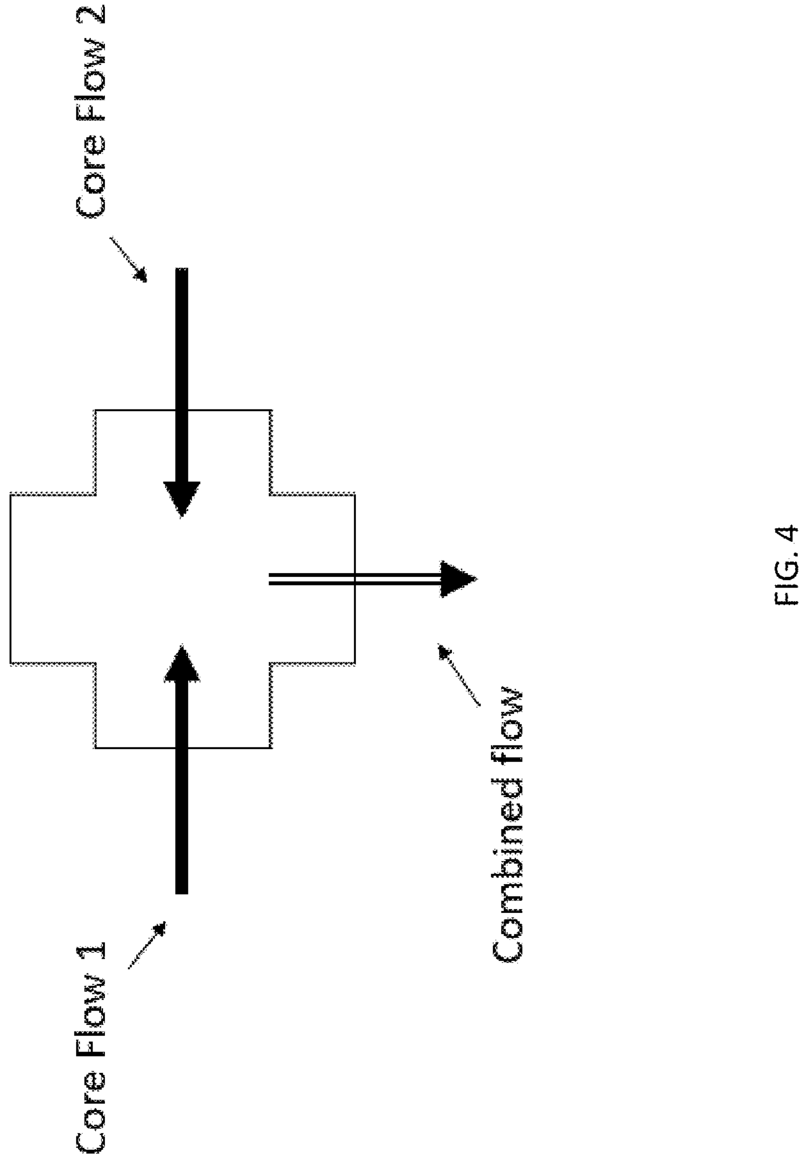
FIG. 4 illustrates an example core flow module of a plasma apparatus for processing feed material.

As shown in FIG. 4, in some embodiments, the core flow module combines two opposingly oriented gas flows, which form a bend before mixing and flowing into the swirl module downstream of the core flow module. In some instances of this configuration, the core plasma gas flow and the swirl flows may impinge on each other and create undesirable flow deviations that vary with time. Although these deviations can assist with flow mixing, the deviations create non-uniformity in the resulting plasma and reduce flow coherence. In essence, the plasma plume needs to constantly 'update' to the variable incoming flow pattern.

According to some embodiments, a new flow paradigm is described herein for the core flow module, in which a vortex or swirling component is added to the flow, upstream of the swirl module. Combining the swirling flow component from the core flow module with the swirl flow from the swirl flow module forms a composite flow, which enters the liner region. In some embodiments, the composition and temperature of gas flows from the core swirl flow and the swirl flow module are substantially similar or identical. These flows may form the "composite flow" (i.e., two upstream swirl flows). However, the outer swirling flow from the swirl flow module, introduced after the core swirl flow, may be injected at a significantly higher velocity at the outer perimeter of the flow, so as to shield the liner from the hot temperature of the ionized core swirl flow. The high angular momentum of the swirl flow from the swirl flow module thrusts it outward toward the perimeter, keeping it outside and away from the core swirl flow. In some embodiments, the inlet speed of the swirl flow is preferably 3.5×-9× faster than the core swirl flow, although acceptable performance may be achieved at an even broader range such as, for example, 1.5×-20× faster than the core swirl flow.

Figure 5:
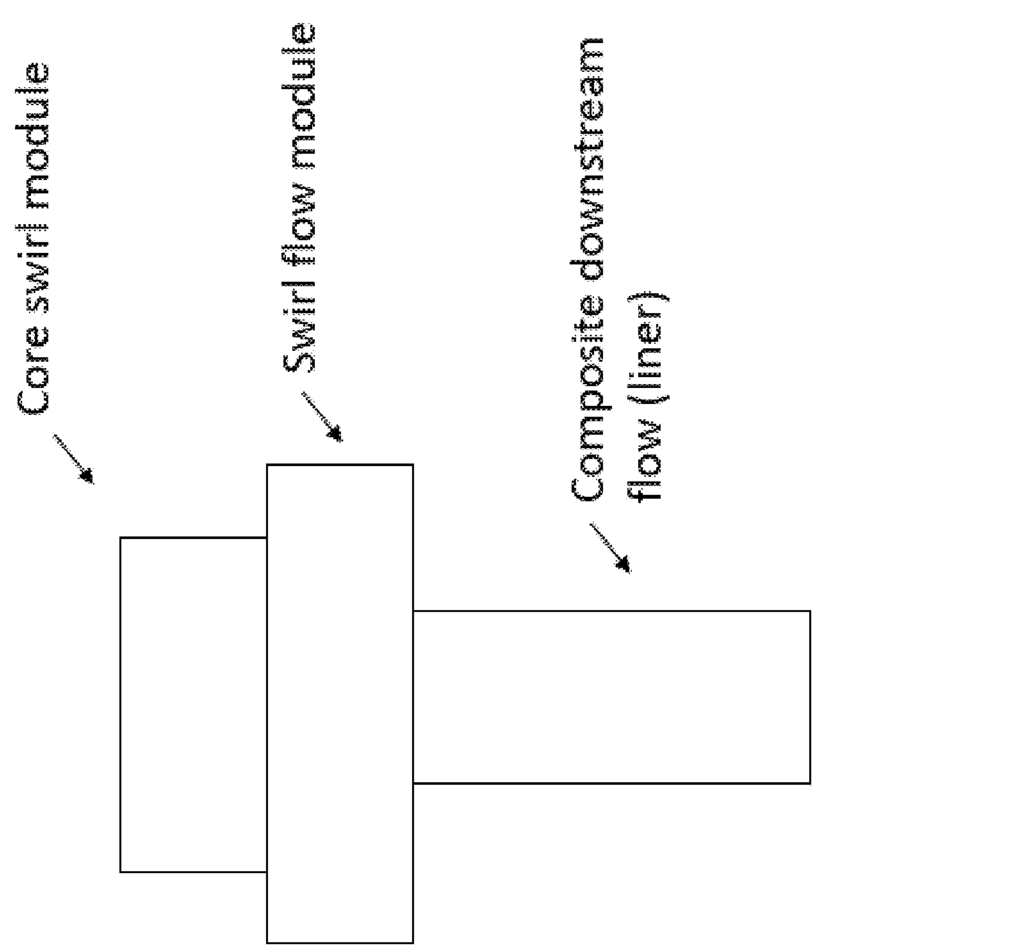
FIG. 5 illustrates an example microwave plasma processing apparatus according to some embodiments herein.

FIG. 5 illustrates an example microwave plasma processing apparatus according to some embodiments herein. As illustrated in FIG. 5, the microwave plasma apparatus comprises a core swirl module upstream of the swirl flow module. In some embodiments, adding swirl to the core flow provides coherence and uniformity to the gas flow. In the configuration of FIG. 5, any deviation from the nominal flow pattern will be a matter of degree and not of form, whereas the core flow module configuration of FIG. 3 creates variability in the flow form. In some embodiments, the swirling nature of the upstream core swirl flow provides fullness and stability to the plasma flame and expands the input flow ranges allowable to maintain the plasma. For example, in some embodiments herein, the power/flow ration may range from about 0.3 kW/scfm to about 5.5 kW/scfm. Thus, in some embodiments, at a low power around 10 kW, the gas flow rate of either the core swirl flow or the outer swirl flow could be as low as 1.8 scfm, and at a high power of 100 kW, gas flow could be as high as 330 scfm. The process sequence according to FIG. 5 begins with the core swirl module, followed by the swirl flow module, a microwave plasma applicator and generation zone, and the material feed. In some embodiments, a quenching gas may be introduced in the same location as the material feed. This process flow and plasma apparatus configuration differs from conventional configurations as the configuration of the embodiments herein involves generation of gas swirl flow upstream of the plasma applicator and material feed. For example, in the process sequence shown in FIG. 2B, a core flow module is located upstream of the plasma applicator and generator. The core flow module generates a substantially straight gas flow towards to microwave generator 204. A swirl flow is not generated prior to the microwave generator or the material feed of the plasma apparatus. Rather, a swirl flow is generated downstream of the microwave generator 204 and the material feed.

Figure 6:
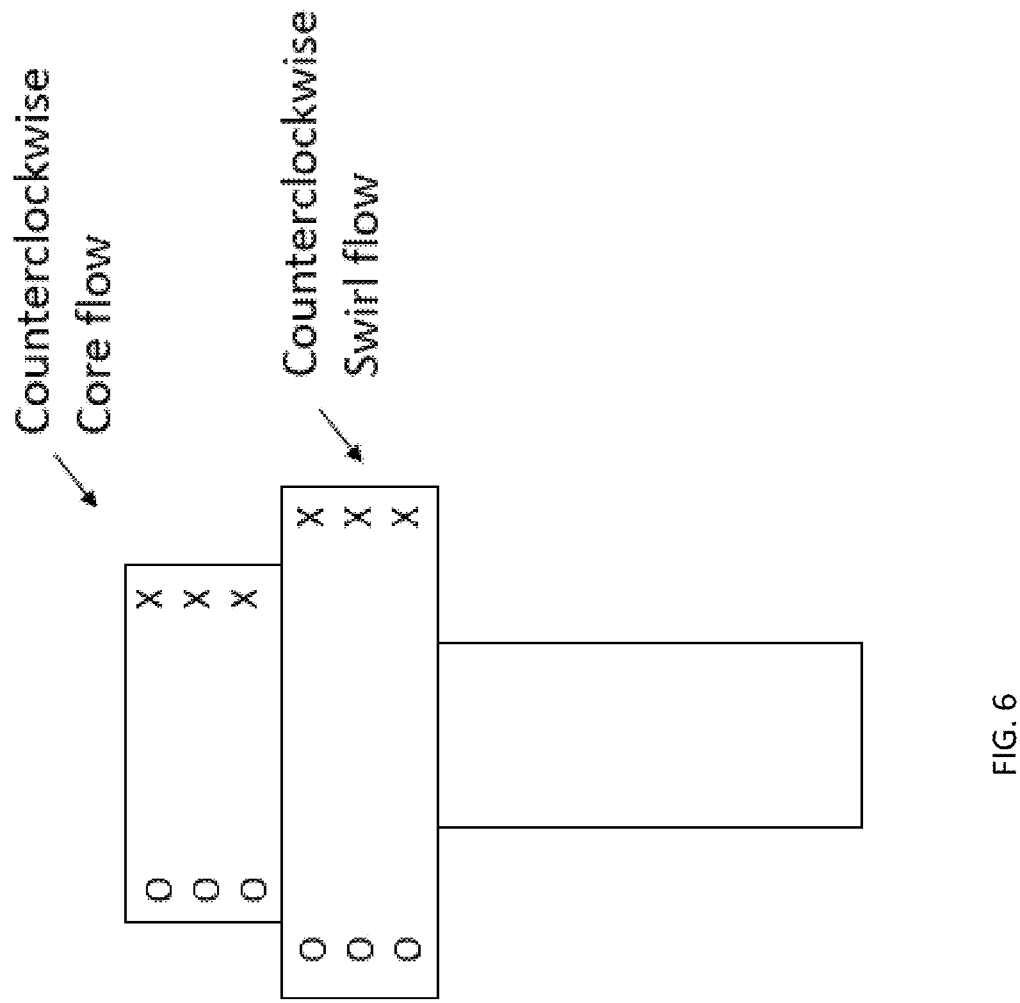
FIG. 6 illustrates an example core swirl flow module and swirl flow module for generating a counterclockwise flow according to some embodiments herein.

In some embodiments, as shown in the configuration of FIG. 6, the core swirl module and swirl flow module may generate gas flows that are swirling in the same direction. For example, both modules may generate clockwise or counterclockwise flows using corresponding swirl jets. However, using an anti-spin configuration, in which the core swirl flow generates a flow of the opposite orientation to the swirl flow module, also exhibits improved plasma performance relative to a straight core flow. This suggests that core flow coherence, even in opposition to the swirl flow, is important for plasma stability.

Figure 7:
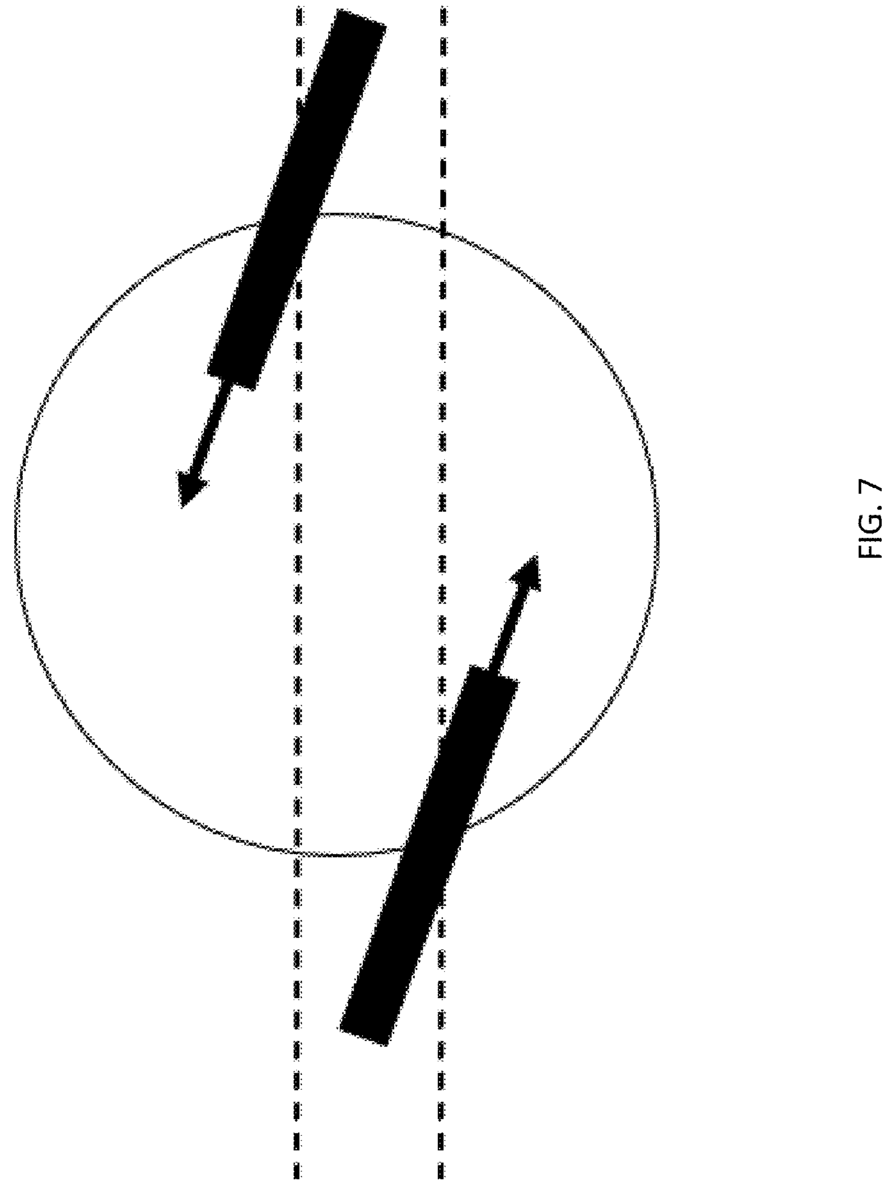
FIG. 7 illustrates an example swirl gas inlet configuration in which a counterclockwise swirl gas flow is generated according to some embodiments herein.
Figure 8:
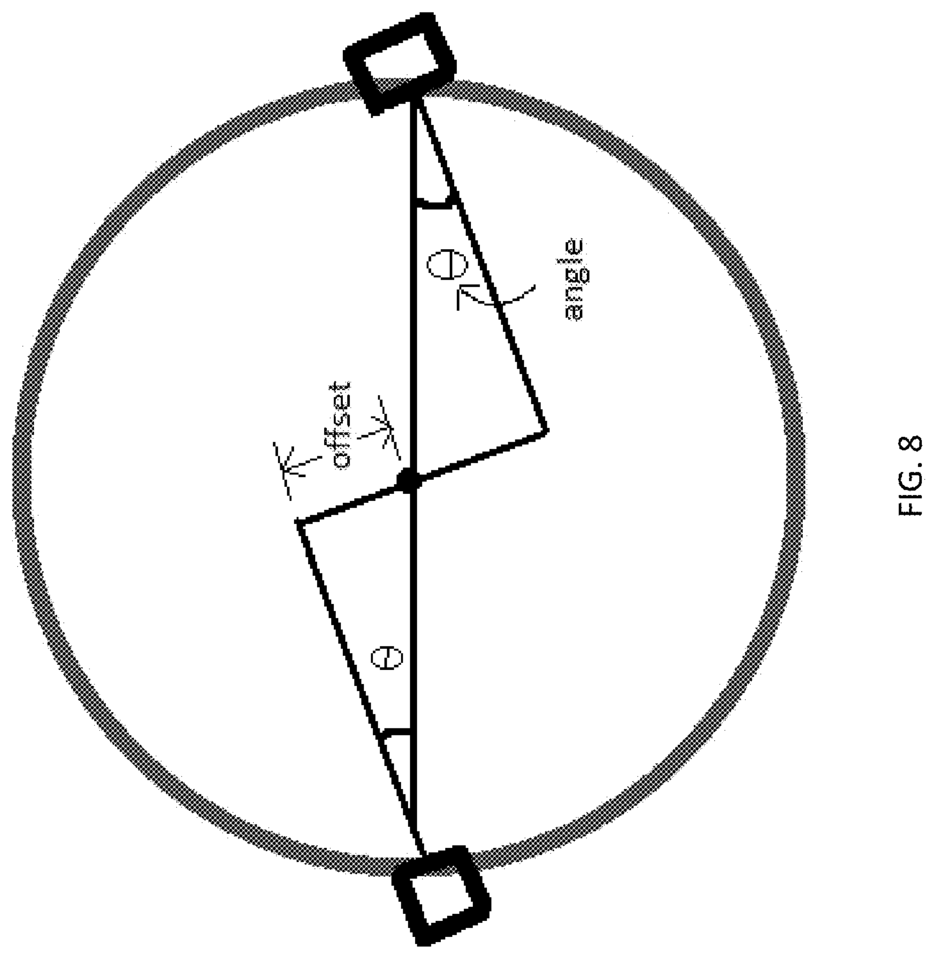
FIG. 8 illustrates an example of the concepts of angle and offset with respect to the jets.

In some embodiments, the swirling core flow can be generated differently across several variables. A number (n=2, 3, 4, 5, 6, 7, 8, 9, 10, 15, 20, 25, 30, 35, 40, 45, 50, 100, or any value between the aforementioned values) of inlet flows can be arranged with offset and tilt relative to a central point of the plasma tube. Orienting the system from a bird's eye view, the "offset" may represent the shortest distance between an inlet's axis and the point of revolution in the center of the system. In other words, instead of jets being pointed directly toward the center, the jets may be angled relative to the central point by some "offset." Thus, in some embodiments, the jets are "angled", or the jets are "offset." FIG. 8 illustrates an example of the concepts of angle and offset with respect to the jets. For example, one or more inlet flows may be oriented relative to the center point at an angle of about 0°, about 5°, about 10°, about 15°, about 20°, about 25°, about 30°, about 35°, about 40°, about 45°, about 50°, about 55°, about 60°, about 65°, about 70°, about 75°, about 80°, about 85°, about 90°, or any value in between the aforementioned value. In some embodiments, one or more inlet flows may be oriented relative to the center point at an angle of about 9.6° or 10°. For example, the diameter of the core swirl inlets may be less than about 0.335 inches or, between about 0.335 inches and about 0.393 inches. For the secondary swirl module inlets, the diameter may be about 0.023 inches. In some embodiments, the diameter of the swirl module inlets may be between about 0.0161 inches and about 0.0345 inches. Additionally, the inlet diameter of the orifices can be changed to render the desired flow velocity. FIG. 7 illustrates an example swirl gas inlet configuration in which a counterclockwise swirl gas flow is generated.

In some embodiments, the configuration of FIG. 5 comprising a core swirl module and swirl flow module may enable generation of a stable plasma at lower power levels. For example, a stable and uniform plasma may be generated at power levels at about 70 KW or higher. Instability of the convention designs prevents using higher power levels. This instability grew with increasing flows and resulted in arcing and hot spots on the liner of the plasma apparatus. Thus, conventional microwave plasma apparatuses only utilize powers up to 45 kW. Furthermore, the stability achieved with the designs described herein yields a more compact plasma, which therefore interacts less with the liner. For example, when utilizing $Ar/H_2$ gases, this compact plasma allows the reduction of % $H_2$ down to 5% while maintaining stability. In conventional configurations, higher $H_2$ percentages were previously needed in order to keep the plasma more compact.

Microwave Plasma Processing

In a microwave plasma process, the feedstock may be entrained in an inert and/or reducing gas environment and injected into the microwave plasma, the microwave plasma plume, or the microwave plasma exhaust. Upon injection into a hot plasma (or plasma plume or exhaust), the feedstock may undergo a physical and/or chemical transformation (e.g., spheroidization). After processing, the resulting material may be released into a chamber filled with an inert gas and directed into hermetically sealed drums where is it stored. This process can be carried out at atmospheric pressure, in a partial vacuum, or at a slightly higher pressure than atmospheric pressure.

In alternative embodiments, the process can be carried out in a low, medium, or high vacuum environment. The process can run in batches or continuously, with the drums being replaced as they fill up with processed material. By controlling the process parameters, such as cooling gas flow rate, residence time, plasma conditions, cooling gas composition, various material characteristics can be controlled.

Residence time of the particles within a hot zone of the plasma can also be adjusted to provide control over the resulting material characteristics. That is, the length of time the particles are exposed to the plasma determines the extent of melting of the feedstock particles (i.e., surface of the particle melted as compared to the inner most portion or core of the particle). Residence time can be adjusted by adjusting such operating variables of particle injection rate and flow rate (and conditions, such as laminar flow or turbulent flow) within the hot zone. Equipment changes can also be used to adjust residence time. For example, residence time can be adjusted by changing the cross-sectional area of the plasma, by, for example, extending the plasma. In some embodiments, extending the plasma may comprise incorporating an extension tube into the microwave plasma apparatus.

Additional Embodiments

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

Indeed, although this invention has been disclosed in the context of certain embodiments and examples, it will be understood by those skilled in the art that the invention extends beyond the specifically disclosed embodiments to other alternative embodiments and/or uses of the invention and obvious modifications and equivalents thereof. In addition, while several variations of the embodiments of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the embodiments of the disclosed invention. Any methods disclosed herein need not be performed in the order recited. Thus, it is intended that the scope of the invention herein disclosed should not be limited by the particular embodiments described above.

It will be appreciated that the systems and methods of the disclosure each have several innovative aspects, no single one of which is solely responsible or required for the desirable attributes disclosed herein. The various features and processes described above may be used independently of one another or may be combined in various ways. All possible combinations and subcombinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination. No single feature or group of features is necessary or indispensable to each and every embodiment.

It will also be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. In addition, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products. Additionally, other embodiments are within the scope of the following claims. In some cases, the actions recited in the claims may be performed in a different order and still achieve desirable results.

Further, while the methods and devices described herein may be susceptible to various modifications and alternative forms, specific examples thereof have been shown in the drawings and are herein described in detail. It should be understood, however, that the invention is not to be limited to the particular forms or methods disclosed, but, to the contrary, the invention is to cover all modifications, equivalents, and alternatives falling within the spirit and scope of the various implementations described and the appended claims. Further, the disclosure herein of any particular feature, aspect, method, property, characteristic, quality, attribute, element, or the like in connection with an implementation or embodiment can be used in all other implementations or embodiments set forth herein. Any methods disclosed herein need not be performed in the order recited. The methods disclosed herein may include certain actions taken by a practitioner; however, the methods can also include any third-party instruction of those actions, either expressly or by implication. The ranges disclosed herein also encompass any and all overlap, sub-ranges, and combinations thereof. Language such as "up to," "at least," "greater than," "less than," "between," and the like includes the number recited. Numbers preceded by a term such as "about" or "approximately" include the recited numbers and should be interpreted based on the circumstances (e.g., as accurate as reasonably possible under the circumstances, for example ±5%, ±10%, ±15%, etc.). For example, "about 3.5 mm" includes "3.5 mm." Phrases preceded by a term such as "substantially" include the recited phrase and should be interpreted based on the circumstances (e.g., as much as reasonably possible under the circumstances). For example, "substantially constant" includes "constant." Unless stated otherwise, all measurements are at standard conditions including temperature and pressure.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y, and at least one of Z to each be present. The headings provided herein, if any, are for convenience only and do not necessarily affect the scope or meaning of the devices and methods disclosed herein.

Accordingly, the claims are not intended to be limited to the embodiments shown herein but are to be accorded the widest scope consistent with this disclosure, the principles and the novel features disclosed herein.

What is claimed is:

1. A microwave plasma apparatus for processing a material, comprising:

a first swirl module, a second swirl module downstream of the first swirl module, a waveguide downstream of the first swirl module and the second swirl module, and a liner;

the first swirl module in communication with the second swirl module, the first swirl module comprising a plurality of first gas inlets, the plurality of first gas inlets configured to generate a first swirl gas flow towards the second swirl module; and the second swirl module comprising a plurality of second gas inlets, the plurality of second gas inlets configured to generate a second swirl gas flow towards the liner, wherein the first swirl module and the second swirl module are configured such that the first swirl gas flow and the second swirl gas flow are combined into a composite gas flow prior to entering the liner.

2. The microwave plasma apparatus of claim 1, further comprising a microwave power source in communication with the composite gas flow and configured to provide microwave radiation to generate a microwave plasma upon contact with the composite gas flow.

3. The microwave plasma apparatus of claim 2, wherein the microwave power source provides microwave radiation of at least 70 KW.

4. The microwave plasma apparatus of claim 2, further comprising one or more feed material inlets in communication with the first swirl module, the second swirl module, or the liner, the one or more feed material inlets configured to provide a feed material to the microwave plasma.

5. The microwave plasma apparatus of claim 1, wherein the plurality of first gas inlets is configured to generate the first swirl gas flow in a counterclockwise direction.

6. The microwave plasma apparatus of claim 1, wherein the plurality of second gas inlets is configured to generate the second swirl gas flow in a counterclockwise direction.

7. The microwave plasma apparatus of claim 1, wherein the plurality of first and second gas inlets are configured to generate the composite gas flow in a clockwise direction.

8. The microwave plasma apparatus of claim 1, wherein the plurality of first gas inlets is configured to generate the first swirl gas flow in a clockwise direction.

9. The microwave plasma apparatus of claim 1, wherein the plurality of second gas inlets is configured to generate the second swirl gas flow in a clockwise direction.

10. The microwave plasma apparatus of claim 1, wherein the plurality of first gas inlets comprises 2 inlets.

11. The microwave plasma apparatus of claim 1, wherein the plurality of second gas inlets comprises 2 inlets.

12. The microwave plasma apparatus of claim 1, wherein the plurality of first gas inlets comprises more than 2 inlets.

13. The microwave plasma apparatus of claim 1, wherein the plurality of second gas inlets comprises more than 2 inlets.

14. The microwave plasma apparatus of claim 1, wherein at least one of the plurality of first gas inlets is oriented at an angle between 0° and 90° relative to at least one other of the plurality of first gas inlets.

15. The microwave plasma apparatus of claim 1, wherein at least one of the plurality of second gas inlets is oriented at an angle between 0° and 90° relative to at least one other of the plurality of second gas inlets.

16. The microwave plasma apparatus of claim 1, wherein the first swirl gas flow comprises an ionizing gas.

17. The microwave plasma apparatus of claim 1, wherein the plurality of first gas inlets comprises inlet diameters between 0.335 inches and 0.393 inches.

18. The microwave plasma apparatus of claim 1, wherein the plurality of second gas inlets comprises inlet diameters between 0.0161 inches and 0.0345 inches.

19. The microwave plasma apparatus of claim 1, wherein the first swirl module, the second swirl module, and the liner are further configured to direct the composite gas flow to a reaction chamber downstream of the liner.

* * * * *